US012685117B2

(12) United States Patent
Chung et al.

(10) Patent No.: US 12,685,117 B2
(45) Date of Patent: Jul. 14, 2026

(54) SEMICONDUCTOR CIRCUIT PATTERN AND MANUFACTURING METHOD THEREOF

(71) Applicant: UNITED MICROELECTRONICS CORP., Hsin-Chu City (TW)

(72) Inventors: Yu-Chien Chung, Yunlin County (TW); Yu-Chin Huang, Tainan City (TW); Chao-You Hung, Tainan City (TW); Wei-Lin Liu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 482 days.

(21) Appl. No.: 18/116,276

(22) Filed: Mar. 1, 2023

(65) Prior Publication Data

US 2024/0266210 A1     Aug. 8, 2024

(30) Foreign Application Priority Data

Feb. 3, 2023     (CN) .......................... 202310091408.3

(51) Int. Cl.
| | |
|---|---|
| *H01L 21/768* | (2006.01) |
| *H01L 21/027* | (2006.01) |
| *H01L 21/311* | (2006.01) |
| *H01L 23/522* | (2006.01) |
| *H01L 23/528* | (2006.01) |

(52) U.S. Cl.
CPC .... *H01L 21/76816* (2013.01); *H01L 21/0274* (2013.01); *H01L 21/31144* (2013.01); *H01L 21/76831* (2013.01); *H01L 21/76877* (2013.01); *H01L 23/5226* (2013.01); *H01L 23/528* (2013.01)

(58) Field of Classification Search
CPC ............... H01L 23/5226; H01L 23/528; H01L 21/76816; H01L 21/76898; H01L 21/0274; H01L 21/31144; H01L 21/76877
See application file for complete search history.

(56) References Cited

U.S. PATENT DOCUMENTS

| | | | | |
|---|---|---|---|---|
| 6,559,543 | B1 * | 5/2003 | Dunham | H01L 23/5329 |
| | | | | 438/622 |
| 7,785,113 | B2 * | 8/2010 | Mizoguchi | H01R 12/592 |
| | | | | 439/82 |
| 9,559,049 | B1 * | 1/2017 | Chiu | H01L 21/4853 |
| 12,261,172 | B2 * | 3/2025 | Tsai | H10D 84/0193 |
| 2007/0228573 | A1 * | 10/2007 | Matsunaga | H10D 1/68 |
| | | | | 257/E21.582 |
| 2012/0313256 | A1 * | 12/2012 | Lu | H01L 21/76811 |
| | | | | 257/E21.586 |

(Continued)

*Primary Examiner* — John M Parker
(74) *Attorney, Agent, or Firm* — Winston Hsu

(57) ABSTRACT

The invention provides a method for manufacturing semiconductor circuit patterns, which comprises providing a dielectric layer, a mask layer and a first photoresist layer stacked on each other, wherein the first photoresist layer includes a weak pattern, and the weak pattern corresponds to a weak point position, and a first photolithography process is performed to form a first circuit groove in the mask layer, a second photoresist layer is formed, the second photoresist layer includes a compensation pattern, and a second photolithography process is performed to form a compensation groove in the dielectric layer, and a metal layer is filled in the compensation groove.

6 Claims, 9 Drawing Sheets

(56)                    References Cited

U.S. PATENT DOCUMENTS

| | | | | |
|---|---|---|---|---|
| 2022/0130978 | A1* | 4/2022 | Lin .................... | H10D 30/0243 |
| 2022/0375852 | A1* | 11/2022 | Chang .............. | H01L 21/76897 |
| 2023/0163071 | A1* | 5/2023 | Chang .............. | H01L 21/76897 |
| | | | | 257/758 |
| 2024/0179905 | A1* | 5/2024 | Maekura ................ | H10B 43/50 |

* cited by examiner

SEMICONDUCTOR CIRCUIT PATTERN AND MANUFACTURING METHOD THEREOF

BACKGROUND OF THE INVENTION

1. Field of the Invention

The invention relates to the field of semiconductors, in particular to a method for forming compensating circuit patterns.

2. Description of the Prior Art

In the semiconductor manufacturing process, different semiconductor components are often connected with each other by circuit layers. Generally speaking, the circuit layer is a metal pattern formed in the dielectric layer, which contains a plurality of strip-shaped circuits to form a pattern, which can electrically connect semiconductor elements at different positions. In addition, the semiconductor electronic device may include a multi-layer structure, and different layer structures include their own circuit layers, and the circuit layers of different layers can be electrically connected with each other through vertical conductive plugs (also called via).

Usually, a groove can be formed in the dielectric layer by exposure, development and etching steps, and then a conductive layer (such as metal layer) is filled in the groove to form the circuit layer. However, during the exposure, development and etching steps, some parts of the circuit layer may fail to be exposed due to the influence of optical environment, such as small critical dimension, being located at the boundary of different regions, and the shape influence of surrounding patterns, so that the finally formed circuit layers cannot be formed at these parts and are broken, which is not conducive to the yield of semiconductor manufacturing.

SUMMARY OF THE INVENTION

The invention provides a method for manufacturing a semiconductor circuit pattern, which comprises the following steps: providing a dielectric layer, a mask layer and a first photoresist layer which are stacked with each other, wherein the first photoresist layer contains a weak pattern, and the weak pattern corresponds to a weak point position, and performing a first photolithography etching process to form a first conductor groove in the mask layer to form a second photoresist layer which contains a compensation pattern, and performing a second photolithography etching process to form a compensation groove in the dielectric layer, and filling a metal layer in the compensation groove.

The invention also provides a semiconductor circuit pattern, which comprises a dielectric layer, and at least one first circuit pattern is located in the dielectric layer, wherein from a top view, the first circuit pattern comprises a line part and a compensation part, wherein the line part comprises two linear boundaries and the compensation part comprises two arc boundaries, and the line part is connected with the compensation part.

In the conventional technologies, the circuit layer at the weak point is easy to break, thus affecting the quality of the semiconductor electronic device. The invention is characterized in that, after the pattern groove of the circuit layer is formed, the lines of these weak points are compensated while the vertical conductive plug (via) pattern is formed. The invention does not use an additional photomask, so it can achieve the purpose of repairing weak points without increasing the process steps, and has the advantage of improving the process quality.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a schematic diagram showing a manufacturing process of a semiconductor circuit pattern according to the first embodiment of the present invention, in which FIG. 6 is the subsequent step of FIG. 4.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

As mentioned in the prior art, in the exposure, development and etching steps in the semiconductor manufacturing process, the formed circuit layer is easy to break at some positions due to the influence of the optical environment and the low line width. Here, the present invention defines these easily broken positions in the circuit layer as weak points. In the present invention, weak points often appear in regions with complex optical environments, for example, at the junction of pattern dense region (also called dense region) and pattern loose region (also called iso region) in semiconductor circuit patterns, where multiple lines are arranged in parallel, where the low line width region, or where the middle part of one line segment is adjacent to the end of other line segments, etc., which may be the occurrence positions of weak points. Therefore, according to different semiconductor process parameters or different patterns, the positions of weak points may be different. In the actual semiconductor manufacturing process, the circuit layer at the weak point is easy to break, so one of the purposes of the invention is to compensate the circuit layer at these weak points, so that the circuits at these weak points can be repaired after the circuit layer is completed.

Figure 1:
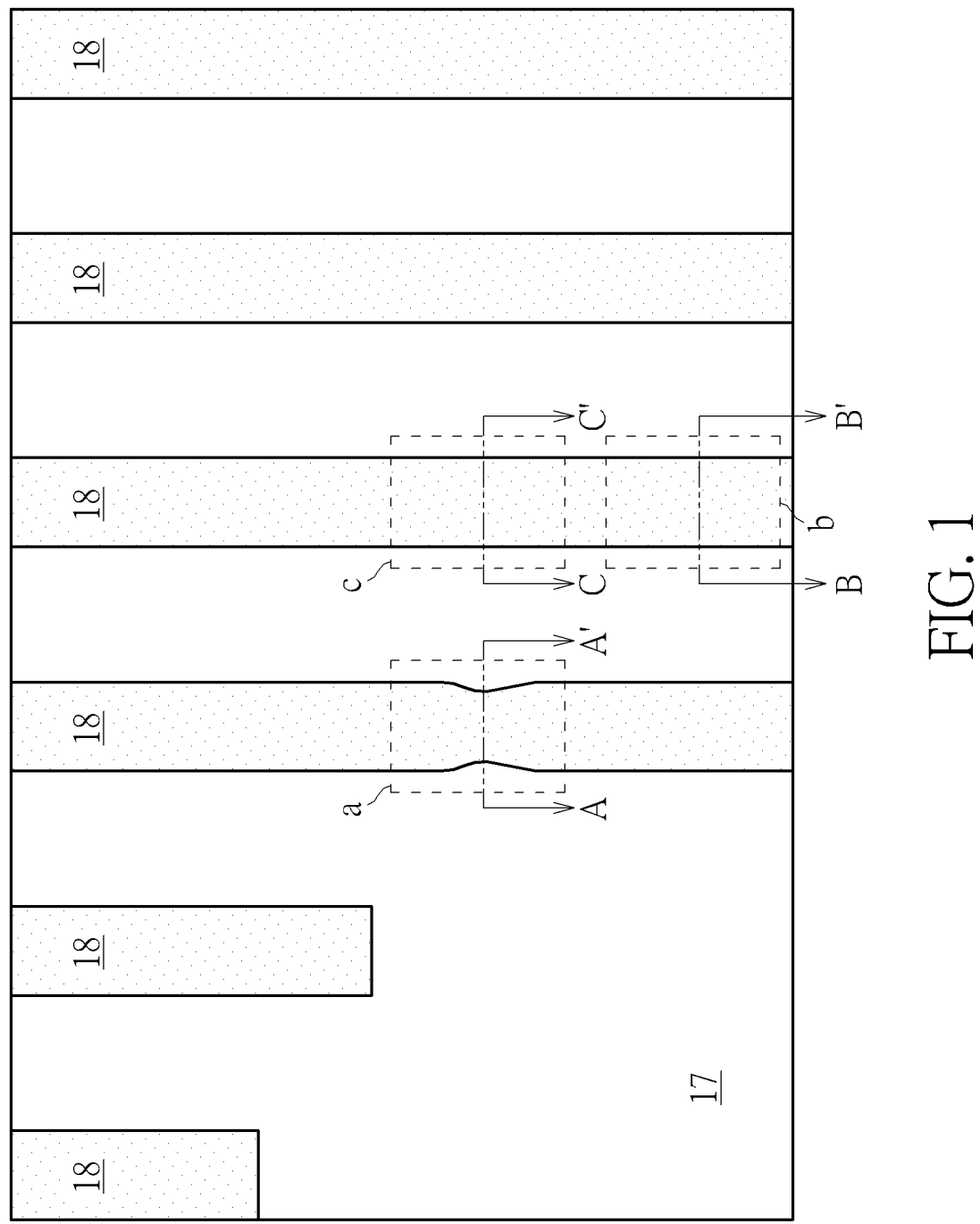
FIG. 1 is a schematic diagram showing a manufacturing process of a semiconductor circuit pattern according to a first embodiment of the present invention.
Figure 2:
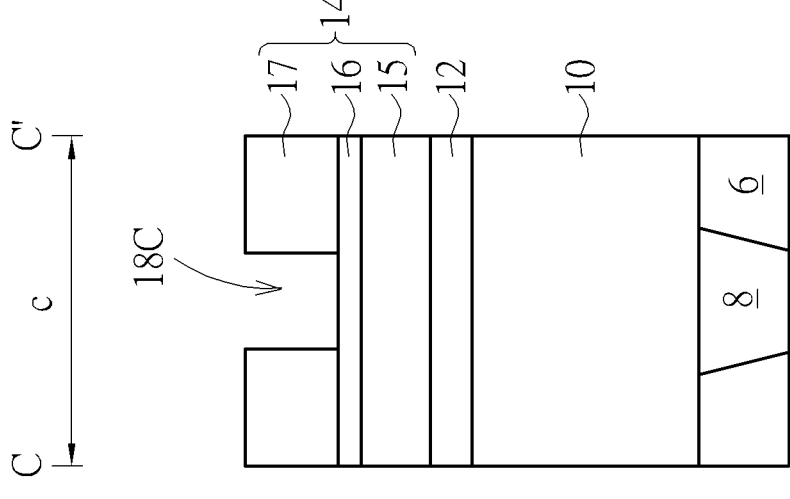
FIG. 2 to FIG. 3 are schematic cross-sectional structures taken along section lines A-A', B-B' and C-C' in FIG. 1, showing cross-sectional views of regions A, B and C in FIG. 1.
Figure 2:
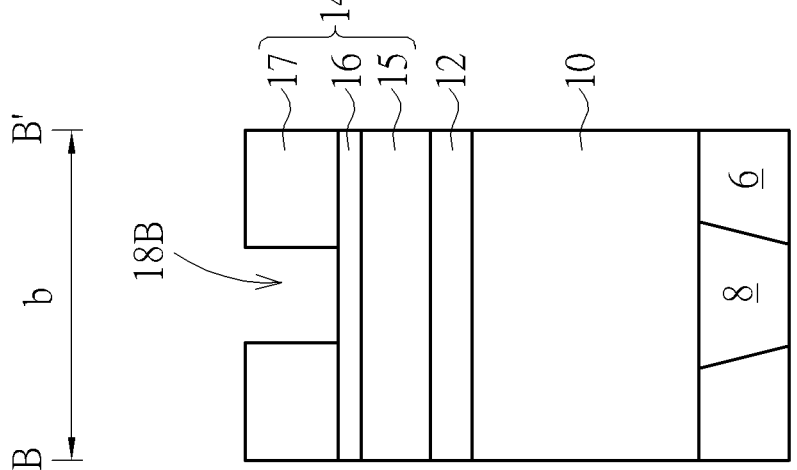
Figure 2:
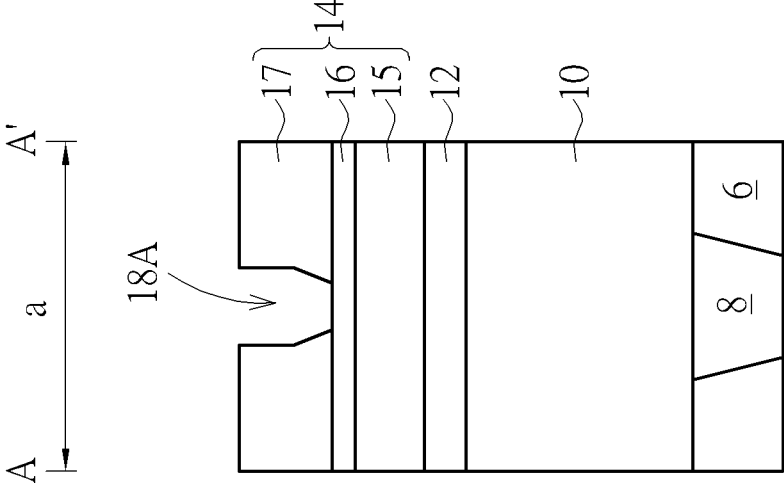
Figure 3:
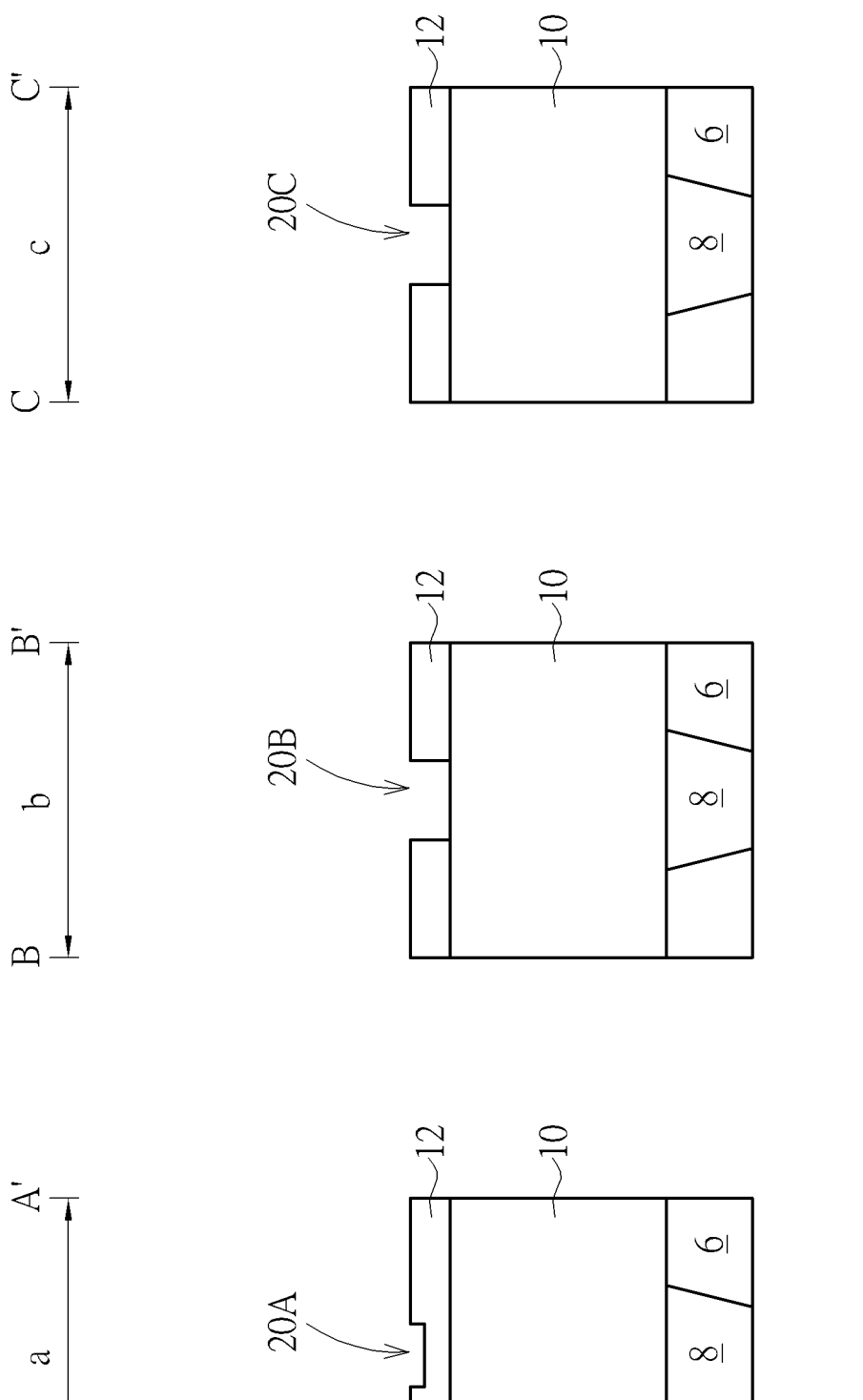

Please refer to FIG. 1, FIG. 2 and FIG. 3. FIG. 1 is a schematic diagram of the manufacturing process of a semiconductor circuit pattern according to the first embodiment of the present invention, and FIGS. 2 to 3 are schematic diagrams of cross-sectional structures taken along section lines A-A', B-B' and C-C' in FIG. 1, showing cross-sectional views of regions a, b and c in FIG. 1.

As shown in FIG. 2, the semiconductor circuit pattern of the present invention includes a dielectric layer 10, a mask layer 12, and a first multilayer photoresist 14 stacked with each other, wherein the dielectric layer 10 is an inter-metal dielectric layer (IMD), and the dielectric layer 10 and the mask layer 12 are made of insulating materials such as, but not limited to, silicon oxide, silicon nitride and silicon oxynitride. The first multi-layer photoresist 14 is, for example, a multi-layer stacked layer, including an organic dielectric layer (ODL)15, a anti-reflection layer (SHB) 16 and a first photoresist layer 17 stacked with each other. However, the present invention is not limited to this. In other embodiments of the present invention, it is also possible to form a single-layer photoresist layer instead of the first multi-layer photoresist 14, and such embodiments are also within the scope of the present invention.

In addition, the dielectric layer 10 may be one of the inter-metal dielectric layers (IMD) in the semiconductor electronic device. When the dielectric layer 10 is not the lowest inter-metal dielectric layer, another dielectric layer 6 may be included under the dielectric layer 10, and a metal circuit layer 8 may be included in the dielectric layer 6. In the following step, the metal circuit layer formed in the dielectric layer 10 will be electrically connected with the underlying metal circuit layer 8 by a vertical conductive plug (also called via). But the present invention is not limited thereto. In other embodiments of the present invention, other metal circuit layers may not be included under the dielectric layer 10, and the metal circuit layers formed in the dielectric layer 10 are connected to structures such as transistors, which are also within the scope of the present invention.

Referring to FIGS. 1 and 2, the first circuit pattern 18 is formed in the first photoresist layer 17 by an exposure and development step. At this time, the top view of FIG. 2 is as shown in FIG. 1, in which a region a, a region b and a region c are defined, wherein the cross sections of the first circuit pattern 18 in the regions a, b and c are grooves 18A, 18B and 18C, respectively. In FIG. 1, the region a corresponds to the position of the weak point, the region b corresponds to the position where the vertical conductive plug (via) is scheduled to be formed in the subsequent process, and the region c corresponds to the position of the general metal circuit (that is, the position where neither the weak point nor the vertical conductive plug is formed). As shown in FIGS. 1 and 2, in the position of the weak point (region a), the width of the groove 18A may be smaller than that of other grooves 18B or 18C. If the width is defined by the critical dimension (CD), the critical dimension of the groove 18A may be 15%~20% smaller than that of the groove 18B or 18C, but the present invention is not limited to this.

In this embodiment, the region a is the weak point. As shown in FIG. 1, there are other first circuit patterns 18 on the upper left of the region a, but there are no first circuit patterns 18 on the lower left, so the region a is the junction of a pattern dense region (dense region) and a pattern loose region (iso region). It should be noted, however, that the above definition of region a as a weak point is only one example of the present invention. As mentioned above, the position of the weak point can be changed according to different patterns or different parameters.

Referring to FIG. 3, the first photoresist layer 17 is used as a mask, and an etching step is performed to form grooves 20A, 20B and 20C in the mask layer 12. The grooves 20A-20C correspond to the positions of the grooves 18A-18C respectively. It is worth noting that the width (or critical dimension) of the above-mentioned groove 18A is smaller than that of other grooves 18B or 18C, resulting in the depth of the groove 20A being shallower than that of other grooves 20B and 20C after the etching step. As shown in FIG. 3, both the grooves 20B and 20C expose the top surface of the lower dielectric layer 10, while the top surface of the groove 20A stops in the mask layer 12, that is, the top surface of the lower dielectric layer 10 is not exposed.

Because the exposure and development process of the weak point (region a) is not complete, if the subsequent steps are continued, the circuit layer in region a may be broken. One of the purposes of the invention is to repair the circuit layer fracture that may be caused by these weak points.

Figure 4:
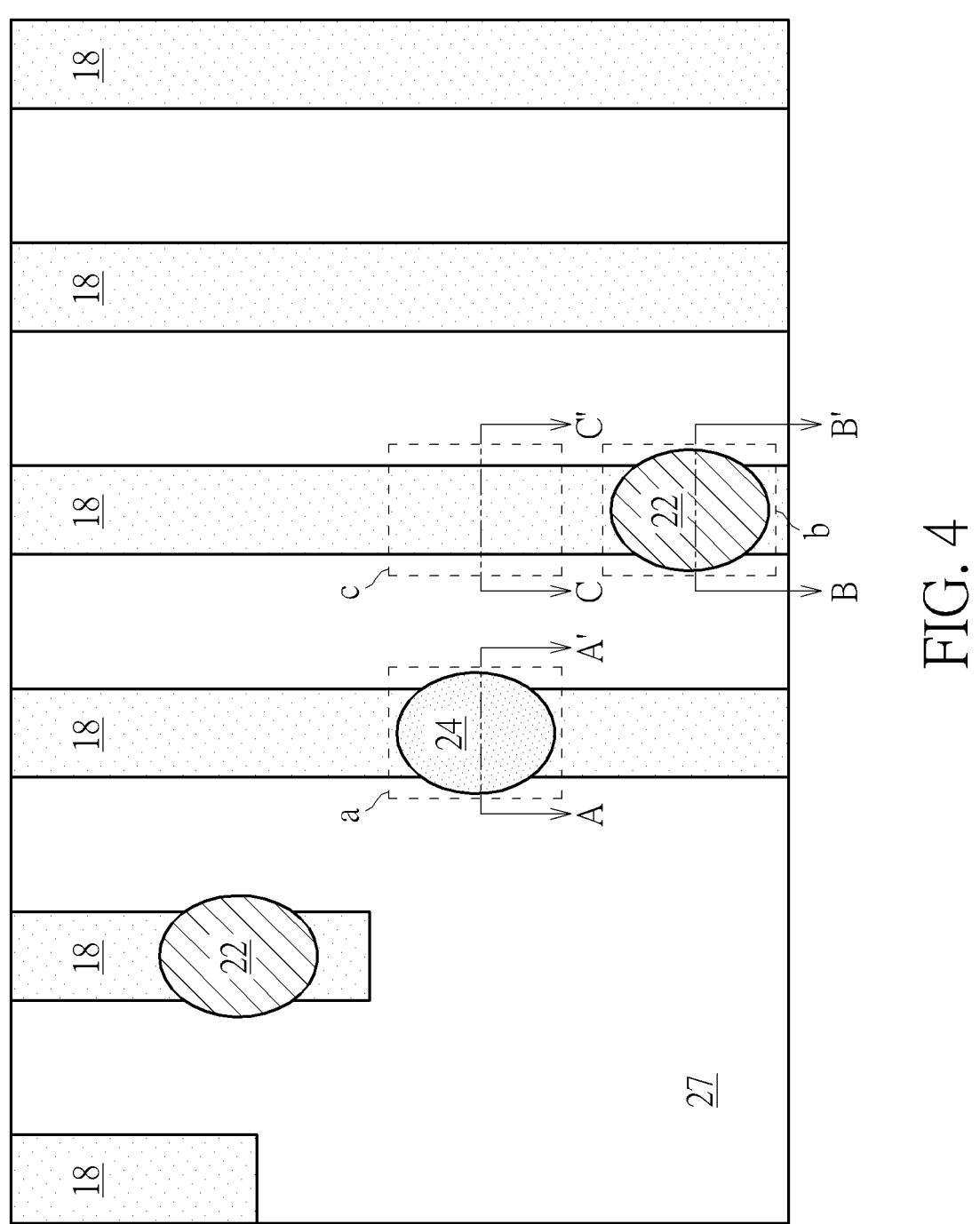
FIG. 4 is a schematic diagram showing the manufacturing process of the semiconductor circuit pattern according to the first embodiment of the present invention, in which FIG. 4 continues the subsequent steps of FIG. 1.

Please refer to FIG. 4, which shows a schematic diagram of the manufacturing process of the semiconductor circuit pattern according to the first embodiment of the present invention, in which FIG. 4 continues the subsequent steps of FIG. 1. As shown in FIG. 4, after the first circuit pattern 18 is completed, in order to connect the first circuit pattern 18 with other circuit layers (such as the metal circuit layer 8), it is necessary to form a pattern of vertical conductive plugs (via). In FIG. 4, the position of part of the conductive plug pattern 22 is shown, which indicates the position where the vertical conductive plugs are formed in the subsequent steps.

It is worth noting that in the present invention, when the conductive plug pattern 22 is formed, the compensation pattern 24 is also formed at the weak point (for example, region a), wherein the critical dimension of the compensation pattern 24 is preferably smaller than that of the conductive plug pattern 22, so that the original circuit structure can be prevented from being influenced by the formation of vertical conductive plugs penetrating the entire dielectric layer at the position of the compensation pattern 24 in the subsequent step. In addition, after the exposure and development steps, the conductive plug pattern 22 and the compensation pattern 24 may assume a shape similar to a circle or an ellipse due to being rounded.

Figure 5:
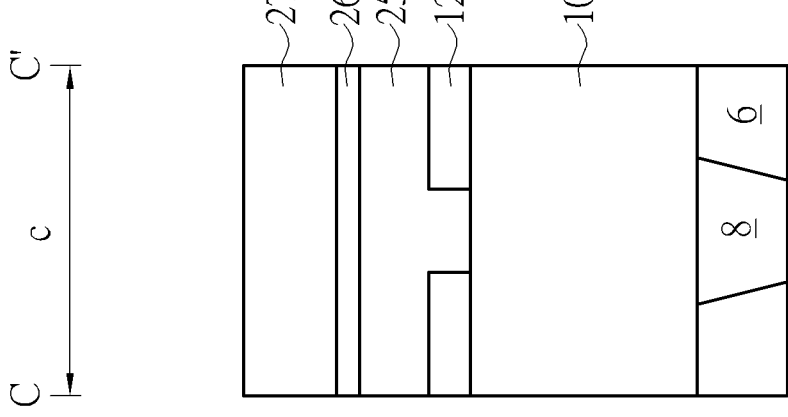
FIG. 5 is a schematic diagram showing the cross-sectional structure of region a, region b and region c in FIG. 4, in which FIG. 5 continues the subsequent steps of FIG. 3.
Figure 5:
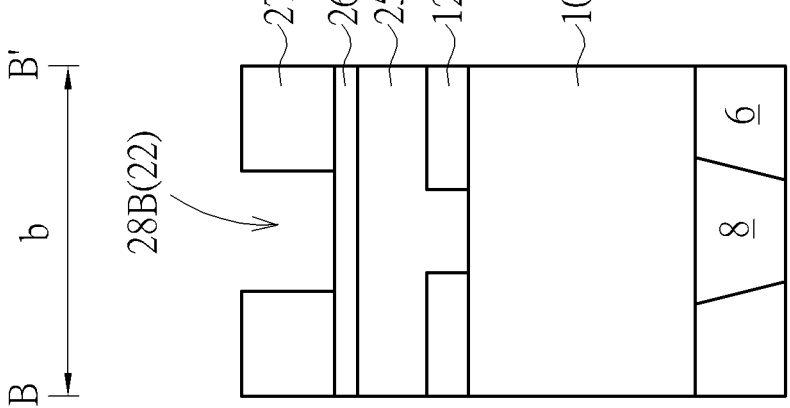
Figure 5:
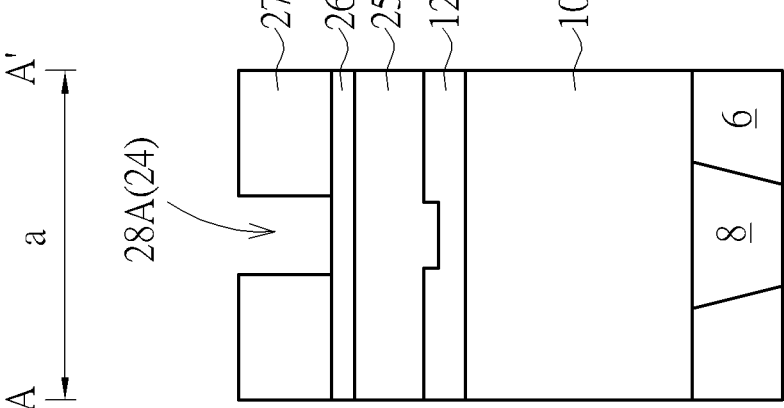

Please also refer to FIG. 5, which is a schematic diagram showing the cross-sectional structure of region a, region b and region c in FIG. 4, wherein FIG. 5 continues the subsequent steps of FIG. 3. As shown in FIG. 5, another organic dielectric layer (ODL)25, an anti-reflection layer (SHB)26 and a second photoresist layer 27 are formed on the mask layer 12, and then an exposure and photolithography process is performed to form grooves 28A and 28B in the second photoresist layer 27, wherein the grooves 28A correspond to the compensation pattern 24 in FIG. 4 and the grooves 28B correspond to the conductive plug pattern 22 in FIG. 4. It is worth noting that, as seen from FIG. 5, the critical dimension (or width) of the groove 28A is smaller than that of the groove 28B. In this embodiment, the depth of the groove in the subsequent dielectric layer can be controlled by the critical dimension of the groove pattern. In other words, if the critical dimension of the groove pattern in the photoresist layer is large, the depth of the groove formed in the dielectric layer after the subsequent etching step is also deep, and vice versa. Therefore, the groove 28A in FIG. 5 corresponds to the compensation pattern 24 in FIG. 4, and its critical dimension is small, and the depth of the groove subsequently formed in the dielectric layer 10 is also shallow.

Figure 6:
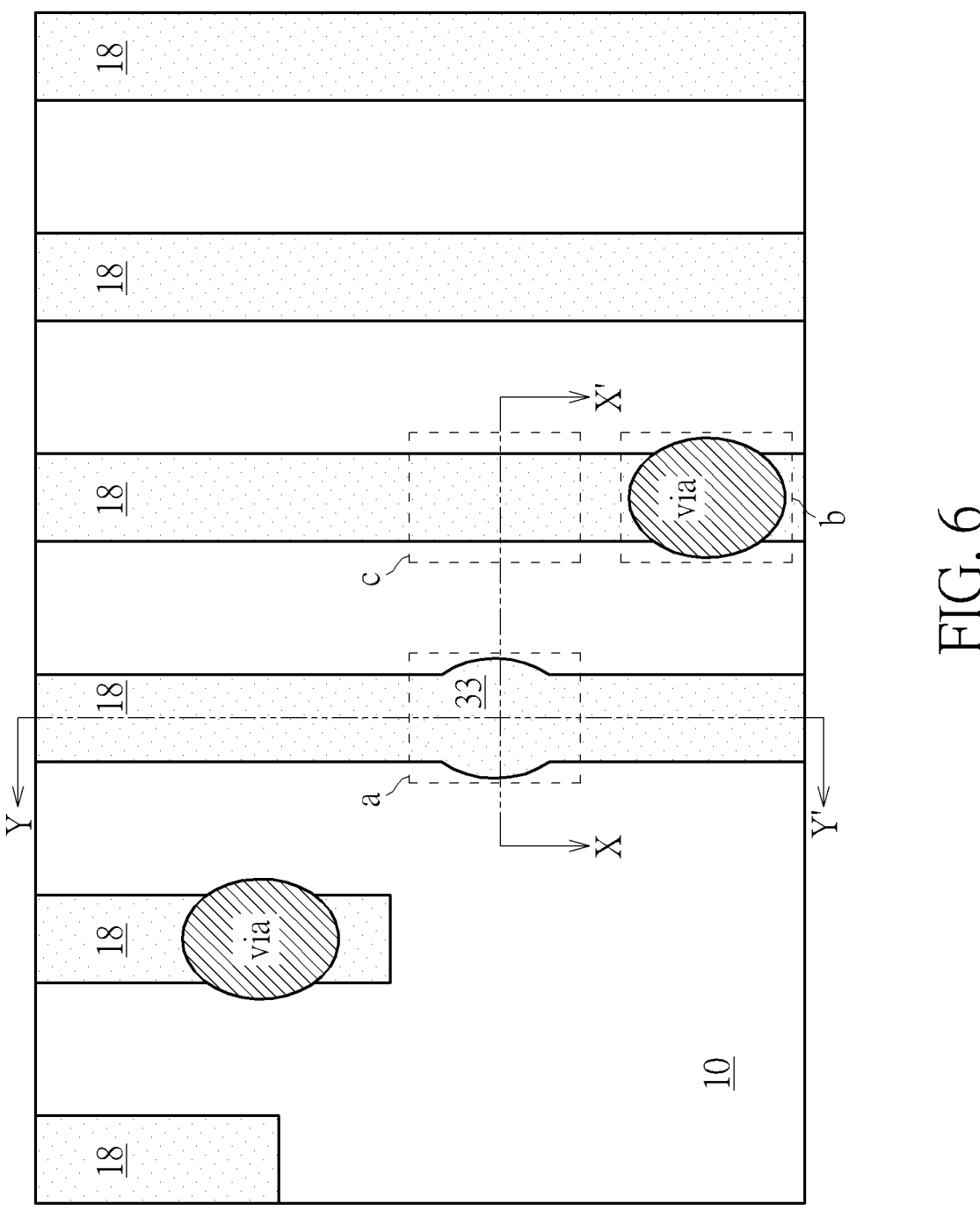
Figure 7:
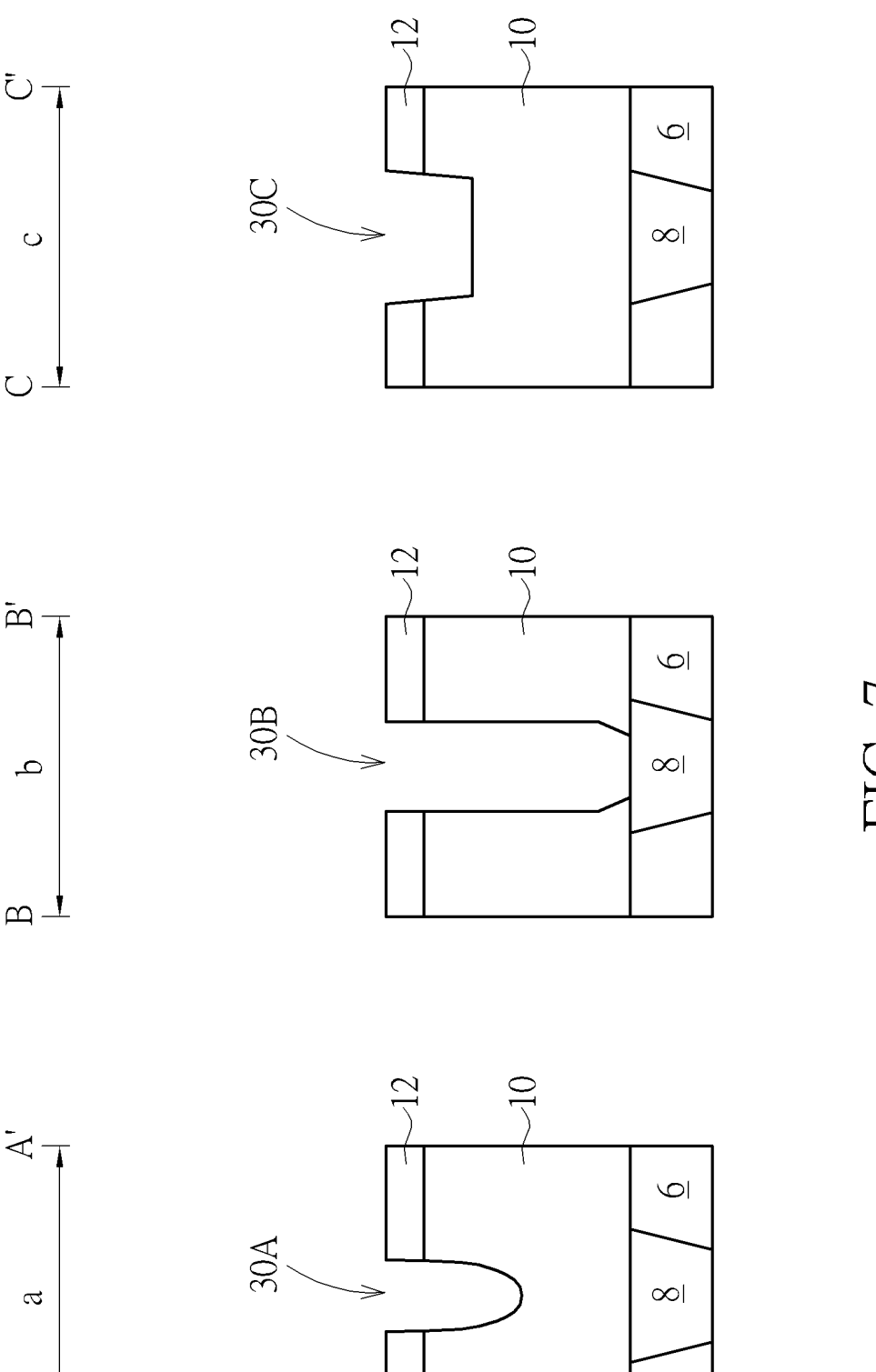
FIG. 7 and FIG. 8 are schematic cross-sectional structural diagrams showing regions a, b and c in FIG. 6, in which FIGS. 7 and 8 continue the subsequent steps of FIG. 5.
Figure 8:
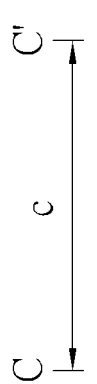
Figure 8:
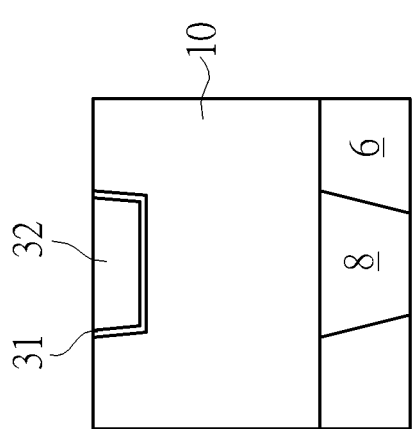
Figure 8:
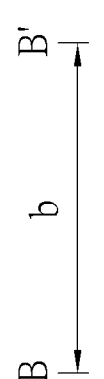
Figure 8:
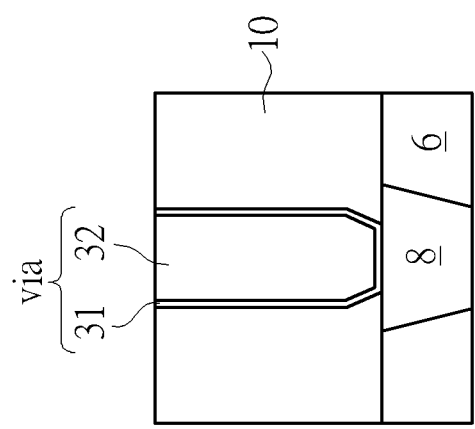
Figure 8:
Figure 8:
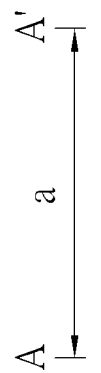
Figure 8:
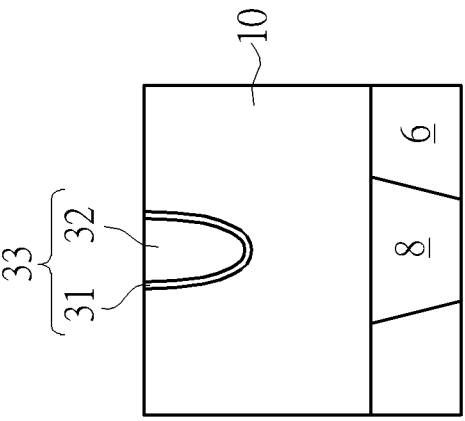

Please refer to FIG. 6, FIG. 7 and FIG. 8. FIG. 6 is a schematic diagram showing a manufacturing process of a semiconductor circuit pattern according to the first embodiment of the present invention, wherein FIG. 6 is the subsequent step of FIG. 4. FIG. 7 and FIG. 8 are schematic cross-sectional structural diagrams showing regions a, b and c in FIG. 6, wherein FIGS. 7 and 8 continue the subsequent steps of FIG. 5. As shown in FIG. 6, the conductive plug pattern 22 and the compensation pattern 24 are transferred to the lower dielectric layer by etching step, and then the conductive layer (such as metal copper, but not limited to this) is filled in to complete the electrical connection between each vertical conductive plug (via) and the circuit layer. In addition, a compensation part 33 is completed at the weak point (region a).

As shown in FIG. 7, through the above etching step, the conductive plug pattern 22 and the compensation pattern 24 are transferred into the lower dielectric layer 10, and grooves 30A, 30B and 30C are formed in the dielectric layer 10. Then, as shown in FIG. 8, a liner layer 31 and a conductive layer (e.g., copper) 32 are filled in the grooves 30A, 30B and 30C, respectively, and a planarization step (e.g., chemical mechanical polishing, CMP) is performed to remove the mask layer 12 to complete the first circuit pattern 18 and the vertical conductive plug (via). In which groove 30A is filled with liner layer 31 and conductive layer 32 to form compensation part 33, and groove 30B is filled with liner layer 31 and conductive layer 32 to form vertical conductive plug (via). As mentioned above, the critical dimensions of the grooves 30A, 30B and 30C are different, so the depths of the grooves 30A, 30B and 30C are also different. In this embodiment, the groove 30A corresponds to the weak point of the compensated line, the groove 30B corresponds to the position of the vertical conductive plug (via), and the groove 30C corresponds to the general wire or circuit. It is worth noting that the depth of the groove 30A is deeper than that of the groove 30C, but the groove 30A does not penetrate through the entire dielectric layer 10, so after the conductive layer 32 is filled, the circuit lines in the region a will not contact the metal line layer 8 below. That is to say, the compensation pattern 24 of the present invention can repair the lines in the weak point region a, but it will not cause electrical errors by mistakenly connecting the lines in the weak point with other metal line layers 8 below.

In addition, please refer to FIG. 6 and FIG. 7 again. Because the compensation pattern 24 has a circular or elliptical shape, from the top view, when the conductive layer 32 is formed, the weak point (region a) of the first circuit pattern 18 will have two arc-shaped edges, while the position without compensation correction (not in the region a) will maintain the original straight edge. On the whole, the two arc-shaped edges will be connected with the straight edge, as shown in FIG. 6.

Figure 9:
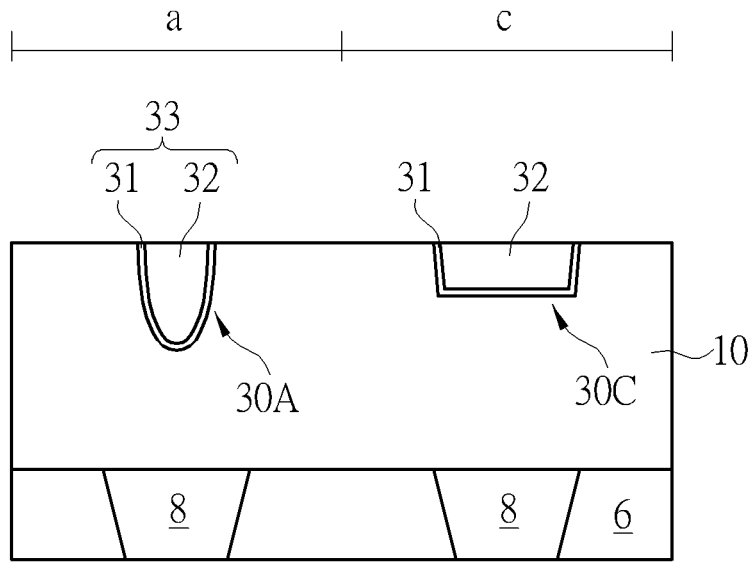
FIG. 9 and FIG. 10 are schematic cross-sectional views taken along the cross-sectional lines X-X' and Y-Y' of FIG. 6, respectively.
Figure 10:
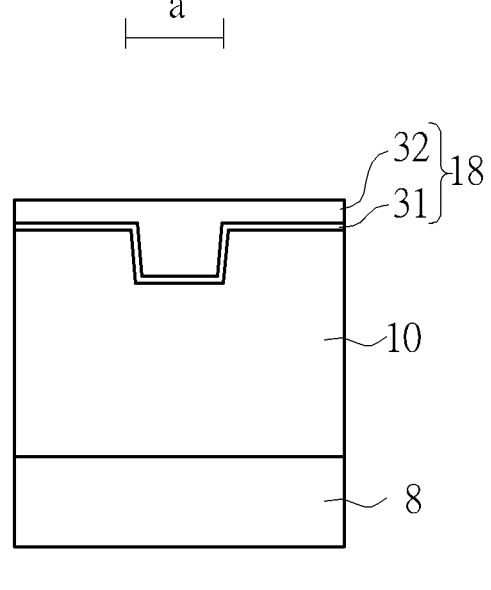

In addition, FIG. 9 and FIG. 10 are schematic sectional views taken along the section lines X-X' and Y-Y' of FIG. 6, respectively. As shown in FIG. 9, the compensated weak point position in region a will form a groove 30A, and the groove 30A will be deeper than the groove 30C of other circuit patterns. As viewed from the X direction, the side wall of the groove 30A has an arc shape, while the groove 30C has an inverted trapezoid shape. As shown in FIG. 10, the depth of the weak point (region a) is deeper than other parts of the same circuit line when viewed from the Y direction.

Based on the above description and drawings, the present invention provides a method for manufacturing a semiconductor circuit pattern, which comprises: providing a dielectric layer 10, a mask layer 12 and a first photoresist layer 17 stacked with each other, wherein the first photoresist layer 17 contains a weak pattern (the groove 18A in FIG. 2), and the weak pattern 18A corresponds to a weak point position (region a), and performing a first photolithography etching process (as shown in FIG. 3), so as to form a first circuit groove 20A in the mask layer 12 and a second photoresist layer 27, which includes a compensation pattern (24 or the groove 28A), and perform a second photolithography etching process (as shown in FIG. 7) to form a compensation groove 30A in the dielectric layer, and filling a metal layer (conductive layer) 32 in the compensation groove 30A.

In some embodiments of the present invention, the first circuit groove 20A does not expose a top surface of the dielectric layer 10.

In some embodiments of the present invention, a bottom of the compensation groove 30A is located in the dielectric layer 10.

In some embodiments of the present invention, a second circuit groove 20B is formed in the mask layer 12 at the same time in the first lithography etching process.

In some embodiments of the present invention, the bottom of the second circuit groove 20B exposes a top surface of the dielectric layer 10.

In some embodiments of the present invention, a ratio of a critical dimension of the first circuit groove 20A to a critical dimension of the second circuit groove 20B is less than 0.67.

In some embodiments of the present invention, a via groove (the groove 30B) is formed in the dielectric layer 10 at the same time during the second lithography etching process.

In some embodiments of the present invention, the via groove 30B exposes a metal circuit layer 8 under the dielectric layer 10.

In some embodiments of the present invention, the position of the weak point corresponds to the boundary between a pattern dense region (dense region) and a pattern loose region (iso region) (for example, as shown in FIG. 1).

In some embodiments of the present invention, a critical dimension of the compensation pattern 24 (or the groove 28A) is greater than a critical dimension of the weak pattern (the groove 18A).

In some embodiments of the present invention, an organic dielectric layer 15 and an anti-reflection layer 16 are further included under the first photoresist layer 17.

In some embodiments of the present invention, the position of the compensation pattern 24 overlaps the position of the weak point (region a).

In some embodiments of the present invention, at least a part of the first circuit groove 18A overlaps the weak point (region a).

The invention also provides a semiconductor circuit pattern, which comprises a dielectric layer 10, and at least one first circuit pattern 18 is located in the dielectric layer 10, wherein, from a top view, the first circuit pattern 18 comprises a line part (except the compensation part 33) and a compensation part 33, wherein the line part comprises two straight boundaries and the compensation part 33 comprises two arc boundaries, and the line part is connected with the compensation part (see FIG. 6).

The present invention also provides a semiconductor circuit pattern, wherein a width of the compensation part 33 is larger than a width of the line part.

The present invention also provides a semiconductor circuit pattern, in which the compensation part has an arc-shaped profile when viewed from a cross-sectional view (see FIG. 8 or FIG. 9).

The present invention also provides a semiconductor circuit pattern, which further includes a second circuit structure (for example, the circuit pattern 18 located in the region c in FIG. 6), and the second circuit structure does not include a compensation part.

The present invention also provides a semiconductor circuit pattern, in which a bottom surface of the compensation part 33 is lower than a bottom surface of the second circuit 18 structure as seen from a cross-sectional view (as shown in FIG. 9).

The invention also provides a semiconductor circuit pattern, which further comprises a metal circuit layer 8 located below the dielectric layer 10, and the first circuit pattern 18 does not directly contact the metal circuit layer 8.

In the conventional technologies, the circuit layer at the weak point is easy to break, thus affecting the quality of the semiconductor electronic device. The invention is characterized in that, after the pattern groove of the circuit layer is formed, the lines of these weak points are compensated while the vertical conductive plug (via) pattern is formed. The invention does not use an additional photomask, so it can achieve the purpose of repairing weak points without increasing the process steps, and has the advantage of improving the process quality.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor circuit pattern comprising:
   a dielectric layer;
   at least one first circuit pattern located in the dielectric layer, wherein from a top view, the first circuit pattern comprises a line part and a compensation part, wherein the line part comprises two straight boundaries and the compensation part comprises two arc boundaries, and the line part is connected with the compensation part, wherein the two arc boundaries of the compensation part are aligned with each other in a horizontal direction; and
   a via contact located beside the first circuit pattern, wherein the compensation part of the first circuit pattern does not contact the via contact.

2. The semiconductor circuit pattern according to claim 1, wherein a width of the compensation part is greater than a width of the line part.

3. The semiconductor circuit pattern according to claim 1, wherein the compensation part has an arc-shaped profile when viewed from a cross section.

4. The semiconductor circuit pattern according to claim 1, further comprising a second circuit structure which does not include the compensation part.

5. The semiconductor circuit pattern according to claim 4, wherein a bottom surface of the compensation part is lower than a bottom surface of the second circuit structure when viewed from a sectional view.

6. The semiconductor circuit pattern according to claim 1, further comprising a metal circuit layer under the dielectric layer, and the first circuit pattern does not directly contact the metal circuit layer.

\* \* \* \* \*